US010147793B2

(12) United States Patent
Obradovic et al.

(10) Patent No.: US 10,147,793 B2
(45) Date of Patent: Dec. 4, 2018

(54) FINFET DEVICES INCLUDING RECESSED SOURCE/DRAIN REGIONS HAVING OPTIMIZED DEPTHS

(71) Applicants: Borna J. Obradovic, Leander, TX (US); Mark S. Rodder, Dallas, TX (US); Jorge A. Kittl, Round Rock, TX (US); Robert C. Bowen, Mount Laurel, NJ (US); Ryan M. Hatcher, Swarthmore, PA (US)

(72) Inventors: Borna J. Obradovic, Leander, TX (US); Mark S. Rodder, Dallas, TX (US); Jorge A. Kittl, Round Rock, TX (US); Robert C. Bowen, Mount Laurel, NJ (US); Ryan M. Hatcher, Swarthmore, PA (US)

(73) Assignee: Samsung Electronics Co., Ltd. (KR)

( * ) Notice: Subject to any disclaimer, the term of this patent is extended or adjusted under 35 U.S.C. 154(b) by 458 days.

(21) Appl. No.: 14/227,812

(22) Filed: Mar. 27, 2014

(65) Prior Publication Data

US 2015/0035074 A1   Feb. 5, 2015

Related U.S. Application Data

(63) Continuation-in-part of application No. 14/226,518, filed on Mar. 26, 2014, now Pat. No. 9,685,509.

(60) Provisional application No. 61/859,932, filed on Jul. 30, 2013, provisional application No. 61/859,922, filed on Jul. 30, 2013.

(51) Int. Cl.
*H01L 29/417* (2006.01)
*H01L 29/66* (2006.01)
*H01L 29/78* (2006.01)

(52) U.S. Cl.
CPC ...... *H01L 29/41791* (2013.01); *H01L 29/785* (2013.01)

(58) Field of Classification Search
None
See application file for complete search history.

(56) References Cited

U.S. PATENT DOCUMENTS

| 7,122,412 | B2 | 10/2006 | Chen et al. |
| 7,238,601 | B2 | 7/2007 | Mathew et al. |
| 7,300,837 | B2 | 11/2007 | Chen et al. |
| 7,667,271 | B2 | 2/2010 | Yu et al. |
| 7,755,104 | B2 | 7/2010 | Yagishita |
| 8,018,787 | B2 | 9/2011 | Oh et al. |

(Continued)

FOREIGN PATENT DOCUMENTS

KR   10-2013-0100362 A   9/2013

OTHER PUBLICATIONS

International Search Report and Written Opinion Corresponding to International Application No. PCT/US2015/017111; dated May 29, 2015; 13 Pages.

(Continued)

*Primary Examiner* — Robert Carpenter
(74) *Attorney, Agent, or Firm* — Myers Bigel, P.A.

(57) ABSTRACT

A finFET device can include a source/drain contact recess having an optimal depth beyond which an incremental decrease in a spreading resistance value for a horizontal portion of a source/drain contact in the recess provided by increased depth may be less than an incremental increase in total resistance due to the increase in the vertical portion of the source/drain contact at the increased depth.

14 Claims, 6 Drawing Sheets

(56) References Cited

U.S. PATENT DOCUMENTS

| | | | |
|---|---|---|---|
| 8,207,038 | B2 | 6/2012 | Cheng et al. |
| 8,278,179 | B2 | 10/2012 | Lin et al. |
| 8,313,999 | B2 | 11/2012 | Cappellani et al. |
| 8,362,568 | B2 | 1/2013 | Lin et al. |
| 8,362,575 | B2 | 1/2013 | Kwok et al. |
| 8,378,394 | B2 | 2/2013 | Anderson et al. |
| 8,420,464 | B2 | 4/2013 | Basker et al. |
| 2006/0202266 | A1 | 9/2006 | Radosavljevic et al. |
| 2008/0099850 | A1 | 5/2008 | Jeon et al. |
| 2009/0166742 | A1 | 7/2009 | Pillarisetty et al. |
| 2011/0201165 | A1 | 8/2011 | Hoentschel et al. |
| 2012/0132989 | A1 | 5/2012 | Haensch et al. |
| 2012/0153387 | A1 | 6/2012 | Murthy et al. |
| 2012/0193713 | A1 | 8/2012 | Kulkarni et al. |
| 2013/0026539 | A1 | 1/2013 | Tang et al. |
| 2013/0105897 | A1 | 5/2013 | Bangsaruntip et al. |
| 2013/0241007 | A1 | 9/2013 | Choi et al. |
| 2013/0285155 | A1 | 10/2013 | Glass et al. |
| 2014/0001520 | A1 | 1/2014 | Glass et al. |

OTHER PUBLICATIONS

Ostling et al. "Challenges for 10 nm MOSFET process integration", *Journal of Telecommunications and Information Technology*, Feb. 2007, pp. 25-32.

Kenney et al. "FinFET Parasitic Resistance Reduction by Segregating Shallow Sb, Ge and As Implants at the Silicide Interface", *2012 Symposium on VLSI Technology Digest of Technical Papers*, 2012, pp. 17-18.

International Preliminary Report on Patentability Corresponding to International Application No. PCT/US2015/017111; dated Sep. 1, 2016; 13 Pages.

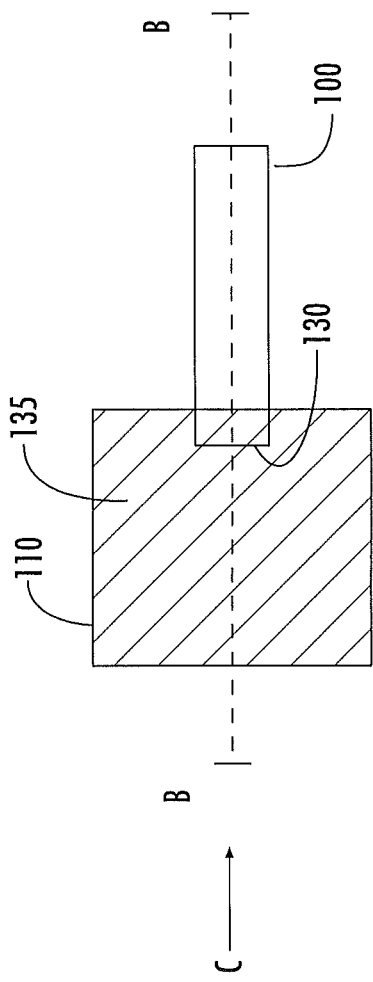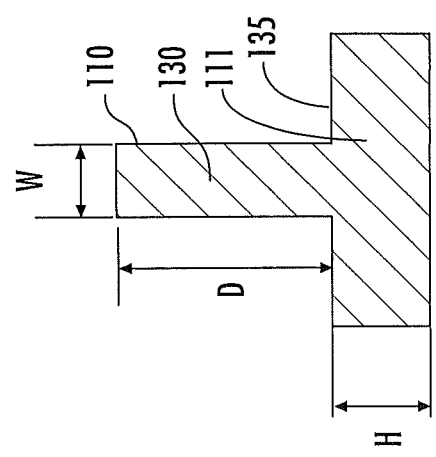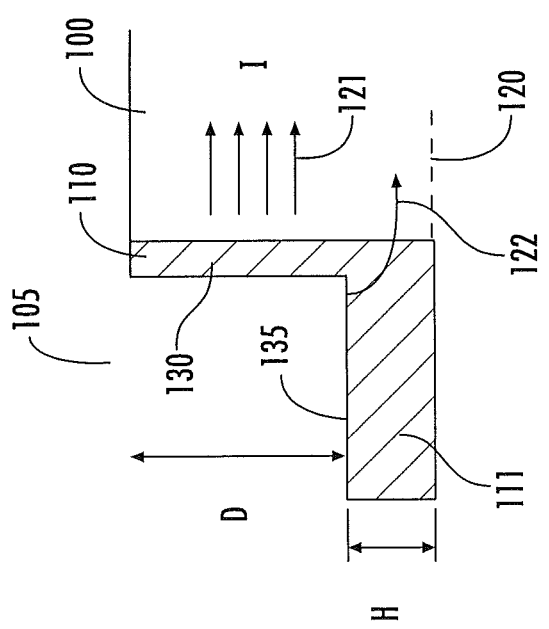
FIG. 1A
FIG. 1C
FIG. 1B

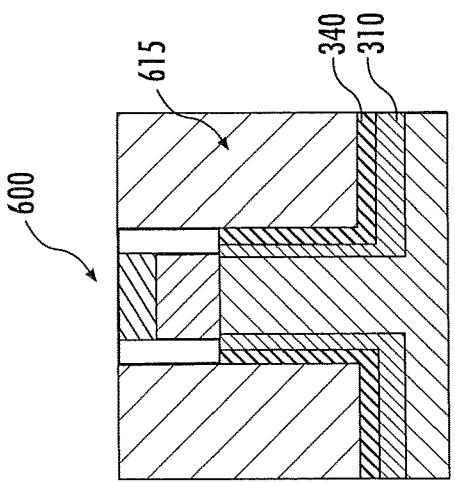
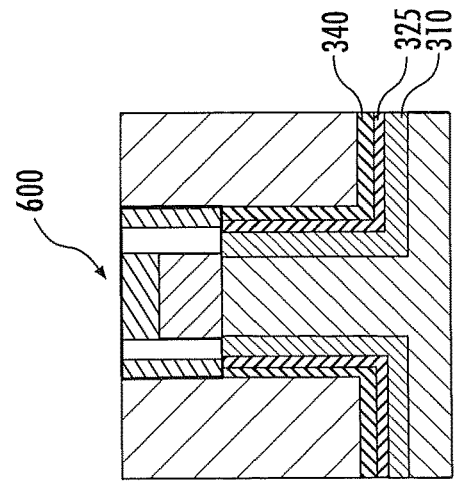
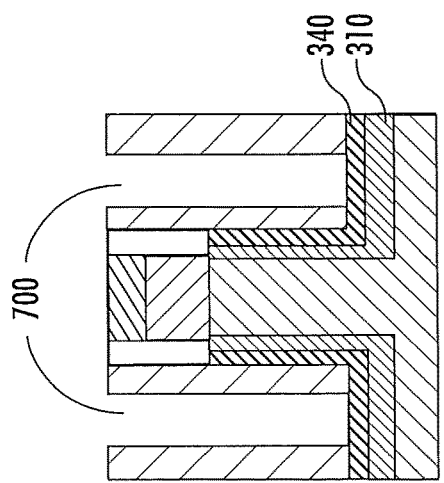
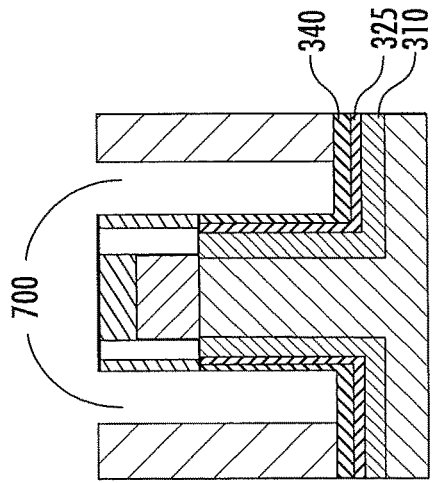
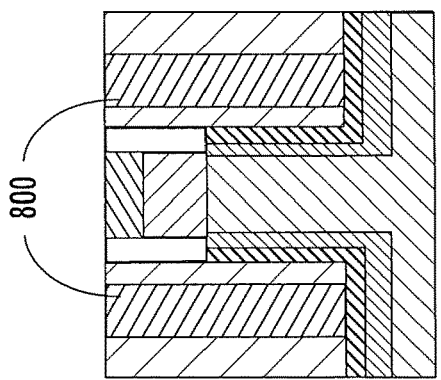
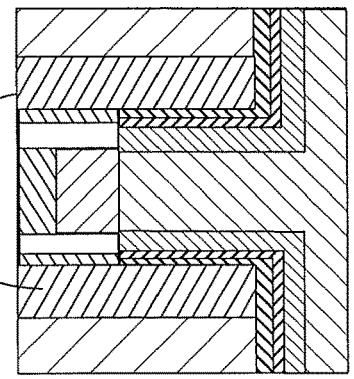

FINFET DEVICES INCLUDING RECESSED SOURCE/DRAIN REGIONS HAVING OPTIMIZED DEPTHS

CROSS-REFERENCE TO RELATED APPLICATIONS

This application is related to, and claims the priority of U.S. Provisional Application Ser. No. 61/859,922, entitled FINFET WITH IMPROVED SOURCE AND DRAIN FORMATION FOR LOW TOTAL PARASITIC RESISTANCE, filed in the USPTO on Jul. 30, 2013 and of U.S. Provisional Application Ser. No. 61/859,932, entitled FINFET WITH RECESSED AND GRADED SOURCE AND DRAIN MATERIAL FOR LOW TOTAL PARASITIC RESISTANCE, filed in the USPTO on Jul. 30, 2013; and of U.S. Non-Provisional application Ser. No. 14/226,518, entitled FINFET DEVICES INCLUDING HIGH MOBILITY CHANNEL MATERIALS WITH MATERIALS OF GRADED COMPOSITION IN RECESSED SOURCE/DRAIN REGIONS AND METHODS OF FORMING THE SAME, filed in the USPTO on Mar. 26, 2014 the entire disclosure of which is incorporated herein by reference.

BACKGROUND

The parasitic series resistance of a finFET device can be an issue in addressing the performance of those devices, particularly when the channel length is reduced. Two components of the total parasitic resistance are the contact resistance between the metal contact and the semiconductor fin, and the spreading resistance of the doped region of the semiconductor fin.

Whether one or the other component is dominant may depend on the barrier height presented by the metal/semiconductor interface. For example, a relatively high barrier height (e.g., 300 meV or more) may result in the total parasitic resistance being dominated by the contact resistance, whereas with a smaller barrier height (on the order of 100 meV or less), the dominant component of the total parasitic resistance may be the spreading resistance.

Parasitic resistance is discussed further, for example, in U.S. Patent Publication numbers 2006/0202266 and 2009/0166742, the disclosures of both of which are incorporated herein by reference in their entireties.

SUMMARY

Embodiments according to the invention can provide optimized finFET devices with a lowered total resistance, including parasitic and channel resistance, by use of recessed source/drain regions and methods of forming the same. Pursuant to these embodiments, a finFET device can include a source/drain contact recess having an optimal depth beyond which an incremental decrease in a spreading resistance value for a horizontal portion of a source/drain contact in the recess provided by increased depth may be less than an incremental increase in total resistance due to the increase in the vertical portion of the source/drain contact at the increased depth.

In some embodiments according to the invention, a finFET device can include a semiconductor fin between doped semiconductor source and drain regions. A metal contact can be on the doped semiconductor source or drain region, providing a vertical and a horizontal interface of the metal contact and the doped semiconductor. A vertical contact resistance value can be defined by an area of the vertical interface and a resistivity of the vertical interface. A spreading resistance value can be associated with the horizontal interface and a recess can be provided for the metal contact, where the recess has a depth that is limited to a point where beyond which an incremental decrease in the spreading resistance value associated with the horizontal interface is less than an incremental increase in a total resistance of the finFET.

In some embodiments according to the invention, the depth of recess is inversely proportional to the resistivity of the vertical interface. In some embodiments according to the invention, the depth of recess (D) is configured to optimize the total current (Ieff) for the finFET according to:

$$\sigma_{tot} = \frac{D}{\rho_{ch} + \rho_c} + \frac{H - D}{\rho_{ch} + \rho_{sp}(H - D)^2}$$

where H is a height of a horizontal interface in the recess, $\rho_C$ is the resistivity of the vertical interface, $\rho_S$ is a spreading resistivity, $\rho_{CH}$ is a channel resistivity of the finFET, $\sigma_{tot}$ is a total conductivity of the finFET device that is proportional to the total current for the finFET.

In some embodiments according to the invention, the depth of the recess varies based on different dopant types included in the doped semiconductor source or drain region. In some embodiments according to the invention, the depth of the recess varies by about 10 nm based on the different dopant types. In some embodiments according to the invention, the doped semiconductor comprises an epi-grown in-situ doped semiconductor.

In some embodiments according to the invention, the finFET device can further include a spreading resistance value associated with the vertical interface and a spreading resistance value associated with the horizontal interface. In some embodiments according to the invention, the resistivity of the vertical interface and the depth of the recess are substantially related as shown by a line segment in FIG. 2, which is incorporated herein.

In some embodiments according to the invention, the depth of the recess includes about +/−10 percent of a depth value on the line segment. In some embodiments according to the invention, the finFET device can further include a sidewall spacer on a gate of the finFET, wherein the doped semiconductor source or drain region is self-aligned to the sidewall spacer. In some embodiments according to the invention, the sidewall spacer can be a first sidewall spacer, and the device can further include a second sidewall spacer on the first sidewall spacer, wherein the recess is self-aligned to the sidewall spacer.

In some embodiments according to the invention, a finFET device can include a semiconductor fin between doped epi-grown semiconductor source and drain regions. A metal contact can be on the doped epi-grown semiconductor source or drain region, providing a vertical interface of the metal contact and the doped semiconductor to provide a resistivity of the vertical interface. A recess can be provided for the metal contact, where the recess can define the vertical interface facing the fin to a depth of the recess, wherein the resistivity of the vertical interface and the depth of the recess are substantially related as shown by FIG. 2, which is incorporated herein.

In some embodiments according to the invention, a finFET device can include a source/drain contact recess on a doped semiconductor, the recess having a depth that is limited to a point where beyond which an incremental decrease in a spreading resistance value associated with a horizontal interface at a bottom of the recess is less than an incremental increase in a total resistance of the finFET.

In some embodiments according to the invention, a method of forming a finFET device can be provided by forming a fin structure including a semiconductor. A doped semiconductor source/drain region can be recessed for a contact adjacent to the fin structure to a depth that is limited to a point where beyond which an incremental decrease in a spreading resistance value associated with a horizontal interface between the contact and the doped semiconductor source/drain region is less than an incremental increase in a total resistance of the finFET.

In some embodiments according to the invention, a finFET device can include a semiconductor fin between doped semiconductor source and drain regions. A metal contact can be on the doped semiconductor source or drain regions, providing a vertical and horizontal interface of the metal contact and the doped semiconductor. A recess can be provided for the metal contact, the recess exposing a vertical interface facing the fin to a depth of the recess and a horizontal interface at the bottom of the recess. A vertical contact resistance value can be defined by an area of the vertical interface and a resistivity of the vertical interface. A horizontal contact resistance value can be defined by an area of the horizontal interface and a resistivity of the horizontal interface. A spreading resistance value can be associated with the vertical interface and a spreading resistance value can be associated with the horizontal interface, where the depth of the recess is different for another finFET device not of the same type.

BRIEF DESCRIPTION OF THE DRAWINGS

FIGS. 1A-1C are a plan view, a cross-sectional view, and an end-on view, respectively, illustrating finFET devices including a fin structure with an adjacent recess including a remaining portion of a doped semiconductor material recessed to a depth "D" to provide a recessed source/drain region for the finFET device in some embodiments according to the invention.

FIGS. 3-13B are cross-sectional views illustrating the formation of finFET devices including source/drain regions of doped semiconductor material recessed to a point where the total resistance value of the finFET device is minimized in some embodiments according to the invention.

Figure 2B:
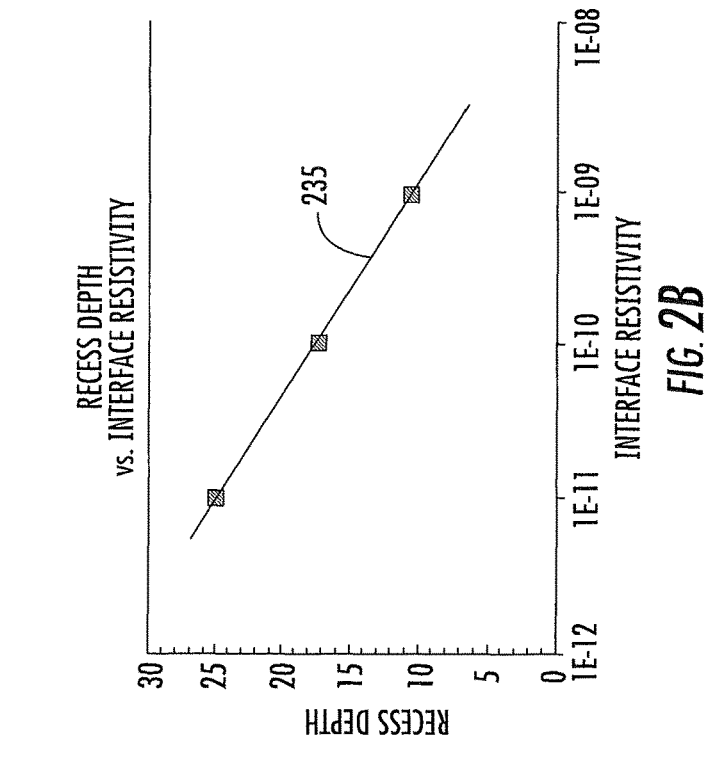
FIG. 2B is a graph illustrating a relationship between recess depth and interface resistivity in some embodiments according to the invention.

DESCRIPTION OF EMBODIMENTS
ACCORDING TO THE INVENTION

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

FIGS. 1A-1C are a plan view, a cross-sectional view, and an end-on view, respectively, illustrating a finFET device including a fin structure 100 with an adjacent recess 105 including a remaining portion of a doped semiconductor material 110 recessed to a depth "D" to provide a doped source/drain region 111 for the finFET device in some embodiments according to the invention. As described herein, the remaining portion of the doped semiconductor material 110 is predetermined to have the depth "D" to minimize the total resistance of the finFET device based on a predetermined barrier height value for the finFET device. For example, the predetermined barrier height value can be determined based on the combination of: the particular semiconductor material used for the doped semiconductor material 110 (e.g., silicon), the particular metal used for the contact on the doped semiconductor material 110 (e.g., nickel silicide), and the particular dopant concentration and type of dopant used for the doped semiconductor material 110 (i.e., n or p type).

It will be understood that the term "contact" can include the metal material formed in the recess on the doped semiconductor material 110, as well as a metal-semiconductor alloy (sometimes referred to herein as a "silicide" when a metal-silicon alloy is formed) that is generated using an alloying process with the doped semiconductor material 110. Accordingly, an interface having an associated contact (interface) resistivity can refer to the boundary where the alloy (or the metal material) contacts the remaining portion of the doped semiconductor material 110.

The predetermined barrier height value can be compared to a predetermined barrier height threshold value to indicate whether the predetermined barrier height value for the finFET device is likely to provide a relatively high barrier height or a relatively low barrier height for the finFET device. If the predetermined barrier height value is determined to be relatively high (such as greater than about 300 meV) then the depth D of the remaining portion of the doped semiconductor material 110 can be reduced in anticipation that the lowest total resistance, including parasitic and channel resistance, will be achieved with a smaller value of D. In some embodiments according to the invention, a relatively high predetermined barrier height value can be greater than about 200 meV. In still other embodiments according to the invention, a relatively high predetermined barrier height value can be greater than about 100 meV. In contrast, if the predetermined barrier height value is determined to be relatively low (such as less than or equal to about 100 meV) then the depth D of the remaining portion of the doped semiconductor material 110 may be larger.

As a first example of predetermined n and p-type barrier heights, contacts to n-type or p-type Si formed with NiSi have barrier heights of ~0.6 eV for NMOS and ~0.5 eV for PMOS, respectively, with interface resistivity on the order of $10^{-8}$ ohm-cm$^2$. As a second example of a predetermined p-type barrier height, contacts to p-type Ge formed by any metal have a barrier height of ~0.1 eV with interface resistivity on the order of $10^{-9}$ ohm-cm$^2$.

As further appreciated by the present inventors, however, in cases where the predetermined barrier height is relatively low, simply increasing the depth D to which the doped semiconductor material 110 is recessed may actually increase the total resistance of the finFET device unless the depth D is limited to a point where beyond which an incremental decrease in a spreading resistance value for a horizontal portion of a source/drain contact in the recess provided by increased depth may be less than an incremental increase in total resistance due to the increase in the vertical portion of the source/drain contact. Accordingly, in some embodiments according to the invention, the depth may be limited to a value where the total resistance does not incrementally increase due to the increase in the vertical portion of the source/drain contact.

The above effect can be described by addressing the relationship of the different components of the total resistance to the different portions of a contact to the fin structure 100. Referring to FIG. 1B, for example, when a metal is formed in the recess 105 on the remaining portion of the doped semiconductor material 110, the contact can include a vertical portion 130 that faces the fin structure 100 and a horizontal portion 135. The current 121 that is conducted into the fin structure 100 can be primarily determined based on the contact resistance component for the vertical portion 130 of the contact, since the spreading resistance component for the vertical portion 130 of the contact, determined by the horizontal length of region 110, is small.

The vertical portion 130 can have a relatively small area due to the fact that the contact is formed to a relatively narrow cross-sectional area defined by the face of the fin structure 100 which the vertical portion 130 faces. Accordingly, even though the vertical portion 130 may have a vertical dimension of "D", the width "W" shown in FIG. 1C illustrates that the overall cross-sectional area can be small due to the narrow width of the fin structure 100.

By contrast, the current 122 that is conducted into the fin structure 100 from the horizontal portion 135 of the contact can be primarily determined based on the spreading resistance component for the horizontal portion 135 of the contact, since the contact resistance component for the horizontal portion 135 of the contact, determined in part by the horizontal length of region 135, is typically small.

The above effects can be further described by noting that as the remaining portion of the doped semiconductor material 110 is further recessed, such that D increases, the area of surface 130 through which the current 121 flows increases. Similarly, as H decreases, the area of surface of height H and in the same plane as surface 130 through which current 122 flows in the channel decreases. For the case in which the contact (interface) resistivity $\rho_C$ is very high (>>1E-9 ohm-cm$^2$), the current 121 that passes through the vertical surface 130 is small in which case the total current flow will be primarily current 122 which is primarily determined by the spreading resistance and not by contact resistance. Thus, for the case in which $\rho_C$ is very high, as D increases and H decreases, the total current flow which is primarily comprised of current 122 thus decreases as D increases. For the case in which the which the contact (interface) resistivity $\rho_C$ is very low (<<1E-11 ohm-cm$^2$), the current 121 that passes through the vertical surface 130 can be large in which case the total current flow will be primarily current 121 which is primarily determined by the contact resistance and not by spreading resistance. Thus, for the case in which $\rho_C$ is very low, as D increases and H decreases, the total current flow which is primarily comprised of current 121 thus increases as D increases.

As appreciated by the present inventors, the recessed depth D can be tailored to a point where any further recessing may cause the total current to decrease, rather than increase, due to the value of contact (interface) resistivity, $\rho_C$. A mathematical relationship showing how this depth D can be determined, for the simple case in which current 121 is determined only by contact resistance, $\rho_C$, and current 122 is determined only by spreading resistance, $\rho_S$, is given by:

$$\sigma_{tot} = \frac{D}{\rho_{ch} + \rho_c} + \frac{H-D}{\rho_{ch} + \rho_{sp}(H-D)^2}$$

where $\rho_{CH}$ is the channel resistivity of the fin structure 100, $\sigma_{tot}$ is the total conductivity of the finFET device, and total current is proportional to mot.

Figure 2A:
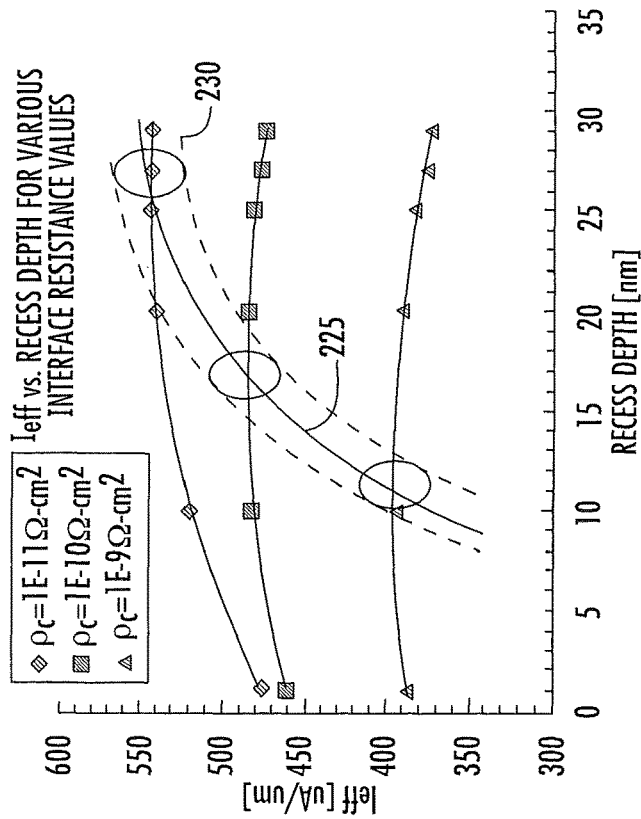
FIG. 2A is a graph illustrating a relationship between effective current and recess depth in some embodiments according to the invention.

FIG. 2A is a graph illustrating a relationship between effective current, similar to total current above, and recess depth in some embodiments according to the invention. According to FIG. 2A, the effective current was determined for three devices each having a respective barrier height configuration. In particular, effective finFET device current is plotted over a range of recess depths for three different contact (interface) resistivities: (A) $1\times10^{-11}$ ohm-cm$^2$, (B) $1\times10^{-10}$ ohm-cm$^2$, and (C) $1\times10^{-9}$ ohm-cm$^2$. As shown in FIG. 2A, in general, starting from a shallow recess depth on the left, the effective current increases as the recess depth increases. For example, Ieff of device (A) increases essentially continuously from the shallow portion to beyond 25 nm indicating that at such a low resistivity, Ieff, which is primarily comprised of current 121, thus increases essentially continuously as D increases.

In contrast, devices (B) and (C) both indicate that the effective current increases starting from the shallow recess depth on the left, and but actually stabilizes and is reduced as the recess is etched further. For example, the data for device (C) shows that at about 13 nm recessed depth, the effective current reaches a maximum value and thereafter decreases as the depth continues to increase. Furthermore, the data for device (B) shows that at about 17 nm recessed depth, the effective current reaches a maximum and thereafter begins to decrease as the recess is further etched. Therefore, for both devices (B) and (C), a particular recess depth can be determined given the particular interface resistivity for the device, beyond which the recess should not be etched further in order to avoid decreasing the effective current.

It will be further understood that although FIG. 2A shows data for only three devices at the illustrated range of recess depths, these relationships can be utilized to extrapolate or interpolate suitable recess depths for finFET devices having a predetermined interface resistivity (which as described herein can be related to the predetermined barrier height). For example, a segment 225 can be drawn to intersect each of the portions of the different curves at about the point where the interface resistance results in the effective current reaching a maximum.

It will be further understood that as shown in FIG. 2A, the point at which the effective current reaches a maximum can be effectively defined to include a range of values 230 on either side of the maximum point such that any other finFET device having a predetermined resistivity can be plotted to intersect the segment 225 and thereby indicate the approximate location where the recess depth results in the maximum. In some embodiments according to the invention, the range of values on either side of the maximum point can be about ±10% of the recess depth at which the maximum is provided.

FIG. 2B is a graph illustrating a relationship between recess depth and interface resistivity in some embodiments according to the invention. In particular, FIG. 2B represents the same data shown in FIG. 2A but directly expresses the relationship between the interface resistivity and the recessed depth. For example, FIG. 2B shows the inversely proportional relationship between the recess depth and the interface resistivity such that as the interface resistivity decreases, the depth to which the recess may be formed to provide an increased Ieff increases.

FIGS. 3-13B are cross-sectional views illustrating the formation of finFET devices including source/drain regions of doped semiconductor material recessed to a point where the total Ieff is a maximum in some embodiments according to the invention. According to FIG. 3, a fin material is etched to form a fin structure 300 between source/drain recesses. In some embodiments according to the invention, a dummy gate structure 305 can be formed on the fin structure 300 as shown. It will be understood that the fin structure 300 can include a semiconductor material, such as Si. Other materials may also be used.

Figure 3:
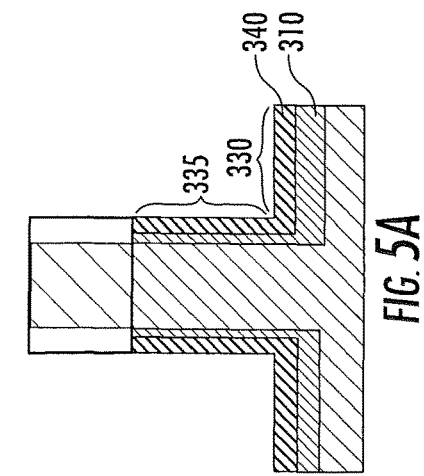

Still referring to FIG. 3, in some embodiments according to the invention, sidewall spacers 315 can be formed along the sidewalls of the dummy gate 305; then, a semiconductor material is epitaxially grown in the source/drain recesses to provide a source/drain material 310 in the recesses. It will be further understood that, during the epitaxial growth of the source/drain material 310, in-situ doping can be utilized to provide a doped epi-grown semiconductor material. Accordingly, if an n type finFET device is to be formed, an n-type dopant can be used for the in-situ doping of the source/drain semiconductor material 310, whereas if a p type finFET device is to be formed, a p-type dopant can be used. In some embodiments according to the invention, an additional anneal can be performed following the epitaxial growth of the source/drain material 310.

Figure 4A:
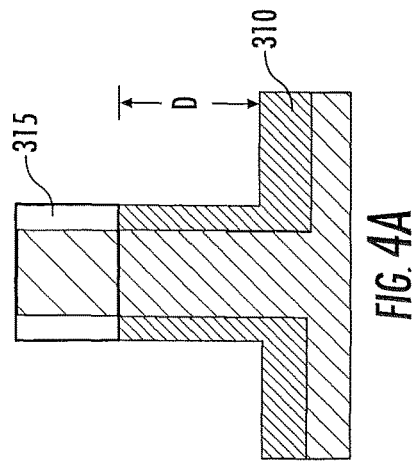

According to FIG. 4A, the source/drain material 310 is etched to a depth D using the sidewall spacers 315. As described herein, the depth D is predetermined to provide the finFET device with a maximum Ieff. Furthermore, and as described herein, the depth D is predetermined based on the metal used for the contact, the semiconductor material 310 and the doping applied to the semiconductor material 310, all of which can be combined to define the barrier height for the contact on the source/drain. For example, if the barrier height for the combination of elements described above provides a relatively high barrier height, the depth D to which the source/drain material 310 is etched can be decreased compared to situations where the combination of material provides a lower barrier height, whereupon the depth of the etching D can be increased, to achieve a maximum Ieff.

Figure 4B:
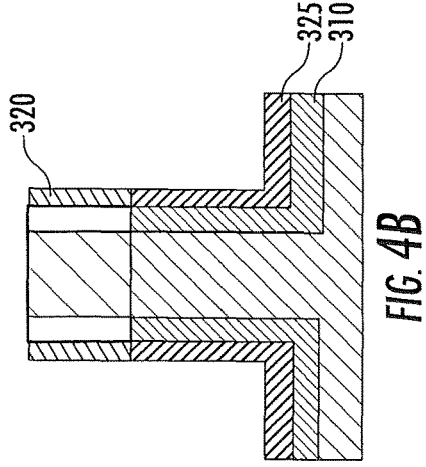

As shown in FIG. 4B, in other embodiments according to the invention, a secondary sidewall spacer 320 can be formed on the sidewall spacer 315 shown in FIG. 4A, after which the source/drain material 310 is etched to a depth D using the sidewall spacers 315 and 320. A second doping of the semiconductor material 310 shown in FIG. 3 can then be performed, using the secondary sidewall spacer 320, to provide a second highly doped semiconductor material 325 on the semiconductor material 310. In some embodiments according to the invention, an additional anneal can be performed.

Figure 5A:
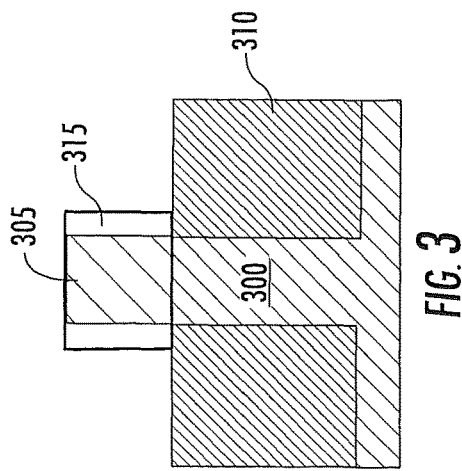

As shown in FIG. 5A, the remaining portion of the semiconductor material 310 shown in FIG. 4A can be subjected to a self-aligned silicide process to form a silicide 340 on a vertical portion 335 and on a horizontal portion 330 of the remaining semiconductor material 310 to provide the contact for the finFET device in some embodiments according to the invention. Accordingly, the vertical portion 335 and the horizontal portion 330 will be understood to define the barrier height for the contact at the interface between silicide 340 and remaining portion of the semiconductor material 310. In other words, in some embodiments according the invention, the silicide 340 and the metal formed on the silicide 340 can be considered together to provide the contact to the finFET.

Figure 5B:
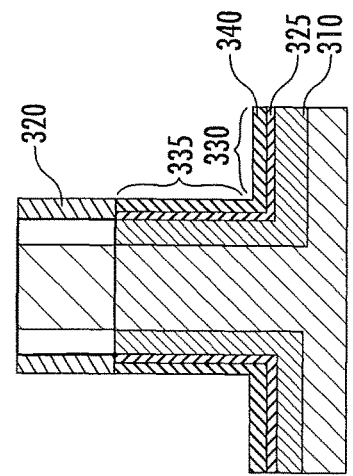

As shown in FIG. 5B, in other embodiments according to the invention, the highly doped semiconductor material 325 shown in FIG. 4B can be subjected to a self-aligned silicide process to form the silicide 340 on both the vertical portion 335 and the horizontal portion 330 of the remaining highly doped semiconductor material 325.

According to FIGS. 6A and 6B, a gate process, shown as a replacement gate process, can be used to form a metal gate structure 600 followed by the deposition of an oxide material 615 which is then planarized. As shown in FIG. 6B, in particular, an analogous process to that described in reference to FIG. 6A can be carried out on the structures described herein that detail the formation of the more highly doped semiconductor material 325 shown, for example, in FIGS. 4B and 5B.

According to FIGS. 7A and 7B, the oxide material 615 is etched to form contact holes 700 exposing the horizontal portion of the silicide 340. As shown in FIG. 7B, in some embodiments according to the invention, it will be understood that the contact holes 700 can expose the silicide 340 on the vertical portions 335 as well on as the horizontal portions 330.

According to FIGS. 8A and 8B, a metal-fill process can be used to deposit a metal 800 in the contact holes 700 to provide electrical contact to the horizontal portion 330 of the silicide 340 in FIG. 8A as well as to the vertical portion 335 of the silicide 340 in FIG. 8B. In other words, the metal 800 in the contact holes 700 can contact both the vertical portion 335 and the horizontal portion 330.

Figure 9A:
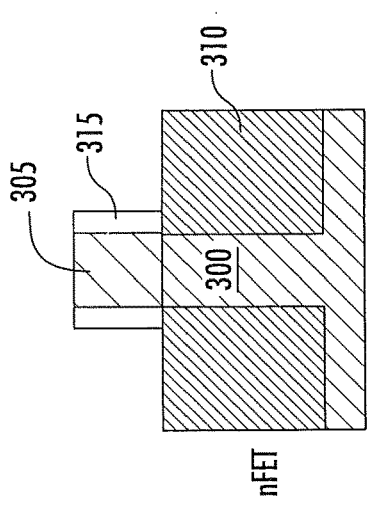
Figure 9B:
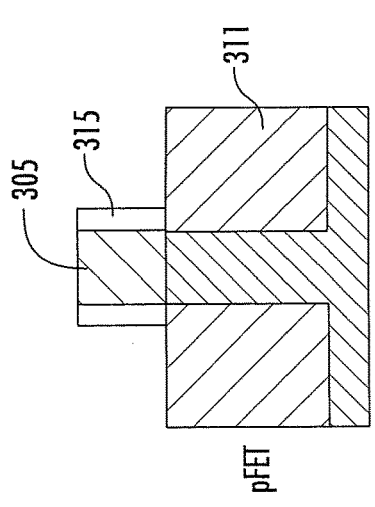
Figure 10A:
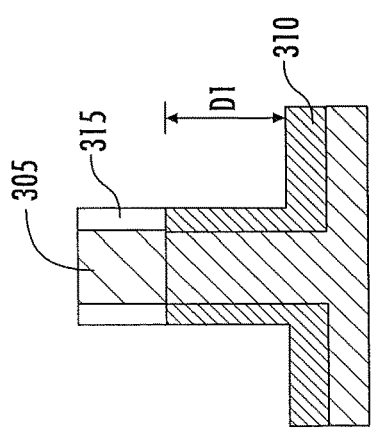
Figure 10B:
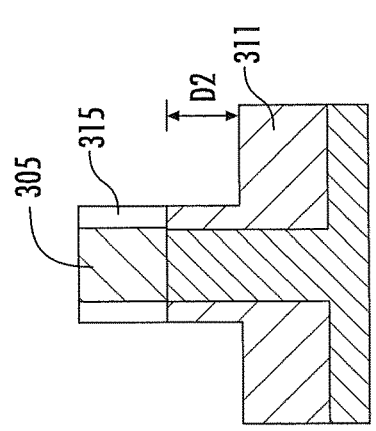
Figure 11A:
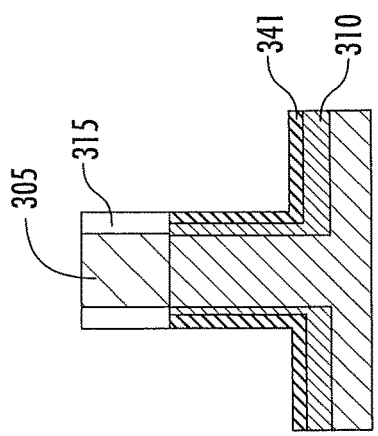
Figure 11B:
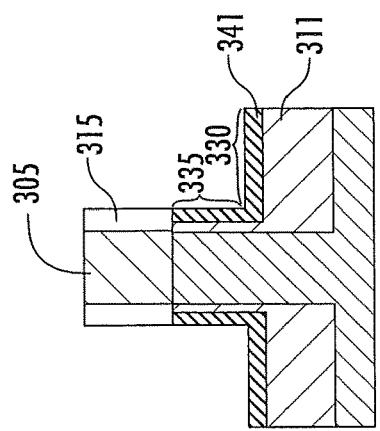

FIGS. 9A-11B illustrate the formation of finFET devices 100 using analogous steps described above in reference to 3-8B to provide a particular type of finFET. In particular, FIGS. 9A, 10A, and 11A are analogous to the operations illustrated in FIGS. 3-5A as relating to the formation of a n-type finFET, whereas FIGS. 9B, 10B and 11B are analogous to the operations shown in FIGS. 9-11A adapted for the formation of a p-type finFET device in some embodiments according to the invention. As shown in FIGS. 9A, 10A, and 11A for the n-type finFET, the semiconductor material 310 can be etched to the predetermined depth D1 in view of the pre-determined barrier height as defined by the silicide, the semiconductor material 310, as well as the n type doping used. In contrast, as shown in FIG. 10B, when a p-type finFET is to be formed, the semiconductor material 311 can be recessed to a predetermined depth D2, which can be different than D1 due to the different barrier height provided by the different silicide 341, in some embodiments of the invention, and by the presence of the p-type dopant in the semiconductor material 311 compared to the n-type dopant included in the semiconductor material shown in FIG. 10A with the n-type finFET device.

It will be understood that although the n-type finFET shown in FIG. 10A is etched to a greater depth than that shown in FIG. 10B (i.e., D2) in the p-type finFET, the reverse may actually be true such that the p-type finFET device is etched to a greater predetermined depth than that used for the n-type finFET. In other words, FIGS. 9A-11B illustrate that the predetermined depth to which the semiconductor material 310 or 311 is etched to define the vertical and horizontal portions of the contact to the finFET device can be dependent upon the type of doping used in the semiconductor material 310 or 311, and further dependent on the type of silicide 340 or 341, and that therefore, the depths to which the n type and p type finFETs are etched are different than one another. In some embodiments according to the inventive concept, the semiconductor material 310 and 311 in the different conductivity type finFET devices is etched to different depths that are at least about 10 nm different from one another but still provide maximum Ieff for each of the n type, and p type finFETs.

Figure 13A:
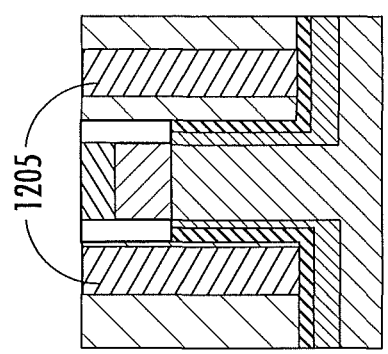
Figure 12A:
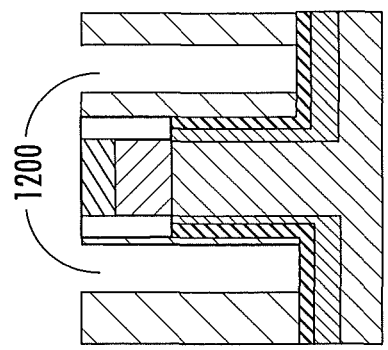

FIGS. 12A-13A are analogous to FIGS. 7A-8A with the additional detail that the formation of the contact holes 1200 may be misaligned on the respective remaining semiconductor material 310. In particular, as shown in FIGS. 12A and 13A, even if the contact holes 1200 are misaligned to the vertical portions of the silicide 340, the metal fill 1205 may still contact the horizontal portions of the silicide 340.

Figure 13B:
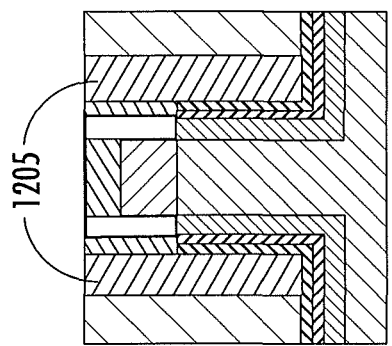
Figure 12B:
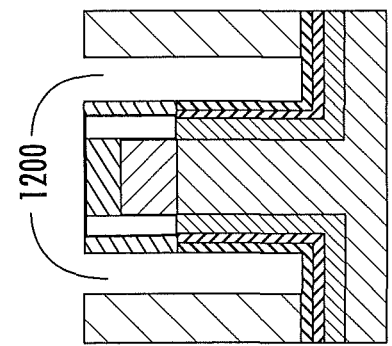

FIGS. 12B and 13B are analogous to the operations shown in FIGS. 7B and 8B with the additional detail that even if the contact holes 1200 are misaligned with respect to the vertical portion of the silicide 340, the metal fill 1205 can still contact both the horizontal portion of the silicide 340 as well as the vertical portion of the silicide 340. As described herein, the remaining portion of the doped semiconductor material 110 is predetermined to have the depth "D" to minimize the total resistance of the finFET device based on a predetermined barrier height value for the finFET device. For example, the predetermined barrier height value can be determined based on the combination of: the particular semiconductor material used for the doped semiconductor material 110 (e.g., silicon), the particular metal used as for the contact on the doped semiconductor material 110 (e.g., nickel silicide), and the particular dopant concentration and type of dopant used for the doped semiconductor material 110 (i.e., n or p type).

As further appreciated by the present inventors, however, in cases where the predetermined barrier height is relatively low, simply increasing the depth D to which the doped semiconductor material 110 is recessed may actually increase the total resistance of the finFET device unless the depth D is limited to a point where beyond which an incremental decrease in a spreading resistance value for a horizontal portion of a source/drain contact in the recess provided by increased depth may be less than an incremental increase in total resistance due to the increase in the vertical portion of the source/drain contact. Accordingly, in some embodiments according to the invention, the depth may be limited to a value where the total resistance does not incrementally increase due to the increase in the vertical portion of the source/drain contact.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed:

1. A finFET device comprising:
   a semiconductor fin between doped semiconductor source and drain regions, wherein one of the doped semiconductor source and drain regions comprises a vertical portion contacting a sidewall of the semiconductor fin and a horizontal portion protruding from the vertical portion, wherein the vertical portion of the one of the doped semiconductor source and drain regions comprises a first surface contacting the sidewall of the semiconductor fin and a second surface opposite the first surface, and the horizontal portion of the one of the doped semiconductor source and drain regions comprises a lower surface extending from the first surface of the vertical portion and an upper surface opposite the lower surface, and wherein the second surface and the upper surface of the one of the doped semiconductor source and drain regions define a recess;

a metal contact on the one of the doped semiconductor source and drain regions, wherein the recess defines a vertical interface and a horizontal interface of the metal contact and the one of the doped semiconductor source and drain regions;

a vertical contact resistance value defined by an area of the vertical interface and a resistivity of the vertical interface; and a spreading resistance value associated with the horizontal interface, wherein the recess has a predetermined depth, and wherein the predetermined depth is determined as a depth of the recess beyond which an incremental decrease in the spreading resistance value associated with the horizontal interface starts becoming smaller than an incremental increase in a total resistance of the finFET device as the depth of the recess increases.

2. The finFET device of claim 1, wherein the depth of the recess is inversely proportional to the resistivity of the vertical interface.

3. The finFET device of claim 1, wherein a total current (Ieff) for the finFET device changes as the depth of the recess (D) changes according to:

$$\sigma_{tot} = \frac{D}{\rho_{ch} + \rho_c} + \frac{H - D}{\rho_{ch} + \rho_{sp}(H - D)^2}$$

where H is a height of the horizontal interface, $\rho_c$ is the resistivity of the vertical interface, $\rho_{Sp}$ is a spreading resistivity, $\rho_{ch}$ is a channel resistivity of the finFET device, $\sigma_{tot}$ is a total conductivity of the finFET device that is proportional to the total current for the finFET device, and wherein, as the depth of the recess (D) increases from about zero, the total current for the finFET device increases until the total current reaches a largest value and then starts decreasing, and wherein the predetermined depth is determined as the depth of the recess (D) at which the total current for the finFET device has the largest value.

4. The finFET device of claim 1, wherein each of the doped semiconductor source and drain regions comprises an epi-grown in-situ doped semiconductor.

5. The finFET device of claim 1 further comprising:

a sidewall spacer on a gate of the finFET device, wherein the one of the doped semiconductor source and drain regions is self-aligned to the sidewall spacer.

6. The finFET device of claim 5, wherein the sidewall spacer comprises a first sidewall spacer, and the finFET device further comprising:

a second sidewall spacer on the first sidewall spacer, wherein the recess is self-aligned to the second sidewall spacer.

7. The finFET device of claim 1, wherein the predetermined depth is +/−10 percent of a value on a line segment of FIG. 2B, which is incorporated herein.

8. The finFET device of claim 1, wherein the vertical portion of the one of the doped semiconductor source and drain regions is interposed between the semiconductor fin and the metal contact.

9. The finFET device of claim 8, wherein the metal contact directly contacts the second surface of the vertical portion of the one of the doped semiconductor source and drain regions.

10. The finFET device of claim 1, wherein an uppermost surface of the vertical portion of the one of the doped semiconductor source and drain regions and the upper surface of the horizontal portion of the one of the doped semiconductor source and drain regions are at different levels.

11. A finFET device comprising:

a semiconductor fin between doped epi-grown semiconductor source and drain regions, wherein one of the doped epi-grown semiconductor source and drain regions comprises a vertical portion contacting a sidewall of the semiconductor fin and a horizontal portion protruding from the vertical portion, wherein the vertical portion of the one of the doped epi-grown semiconductor source and drain regions comprises a first surface contacting the sidewall of the semiconductor fin and a second surface opposite the first surface, and the horizontal portion of the doped epi-grown semiconductor source and drain regions comprises a lower surface extending from the first surface of the vertical portion and an upper surface opposite the lower surface, and wherein the second surface and the upper surface of the one of the doped epi-grown semiconductor source and drain regions define a recess; and a metal contact on one of the doped epi-grown semiconductor source and drain regions, wherein the recess defines a vertical interface of the metal contact and the one of the doped epi-grown semiconductor source and drain regions to provide a resistivity of the vertical interface, wherein the recess has a predetermined depth, wherein as a depth of the recess increases from zero, a total current for the finFET device increases until the total current reaches a largest value and then starts decreasing, and wherein the predetermined depth is determined as the depth of the recess at which the total current for the finFET device has the largest value.

12. The finFET device of claim 11, wherein the predetermined depth is within +/−10 percent of a value on a line segment of FIG. 2B, which is incorporated herein.

13. The finFET device of claim 11, wherein the vertical portion of the one of the doped epi-grown semiconductor source and drain regions is interposed between the semiconductor fin and the metal contact.

14. The finFET device of claim 13, wherein the metal contact directly contacts the second surface of the vertical portion of the one of the doped epi-grown semiconductor source and drain regions.

* * * * *